(12) United States Patent
Meyer

(10) Patent No.: US 6,813,579 B1
(45) Date of Patent: Nov. 2, 2004

(54) APPARATUS AND METHOD FOR TEST MODE CONTROL

(75) Inventor: Eric J. Meyer, Longmont, CO (US)

(73) Assignee: Cirrus Logic, Inc., Austin, TX (US)

( * ) Notice: Subject to any disclaimer, the term of this patent is extended or adjusted under 35 U.S.C. 154(b) by 30 days.

(21) Appl. No.: 10/259,002

(22) Filed: Sep. 27, 2002

Related U.S. Application Data

(60) Provisional application No. 60/340,456, filed on Dec. 14, 2001.

(51) Int. Cl.[7] .................. G01R 31/14; G06F 11/00; H03M 1/10
(52) U.S. Cl. .................. 702/120; 326/82; 341/120; 365/201; 702/125; 714/727
(58) Field of Search ............... 702/116, 117, 702/120, 122, 125; 324/107, 142; 341/155, 120; 714/35, 724, 727, 740; 365/200, 201, 230.06; 370/241

(56) References Cited

U.S. PATENT DOCUMENTS

| | | | | |
|---|---|---|---|---|
| 5,781,485 A | * | 7/1998 | Lee et al. ............... | 365/201 |
| 5,793,749 A | * | 8/1998 | Helwig et al. ........... | 370/241 |
| 5,969,653 A | * | 10/1999 | Sachdev .............. | 341/120 |
| 6,188,621 B1 | * | 2/2001 | Kang ................... | 365/201 |
| 6,384,754 B1 | * | 5/2002 | Park .................... | 341/120 |
| 6,388,926 B1 | * | 5/2002 | Gans et al. ............ | 365/201 |
| 6,404,684 B2 | * | 6/2002 | Arimoto et al. ......... | 365/201 |
| 6,502,209 B1 | * | 12/2002 | Bengtsson et al. ....... | 714/35 |
| 6,529,438 B1 | * | 3/2003 | Suzuki et al. ......... | 365/230.06 |
| 6,567,943 B1 | * | 5/2003 | Barnhart et al. ......... | 714/727 |
| 6,639,426 B2 | * | 10/2003 | Haycock et al. ......... | 326/82 |

\* cited by examiner

Primary Examiner—John Barlow
Assistant Examiner—John Le
(74) Attorney, Agent, or Firm—Steven Lin, Esq.

(57) ABSTRACT

A test mode control unit of an integrated circuit receives and decodes a test mode signal to perform testing of the integrated circuit. Logical AND operations are performed on the decoded test control signal and a test signal. The test signal allows the integrated circuit to toggle between test and non-test modes of operation. In one instance, the toggling allows real time debugging of the integrated circuit when test data outputs of internal signals or states are multiplexed onto a data bus.

20 Claims, 5 Drawing Sheets

APPARATUS AND METHOD FOR TEST MODE CONTROL

This application claims the benefit of priority from U.S. Provisional Patent Application Ser. No. 60/340,456 entitled "DSP Audio Decoder" filed on Dec. 14, 2001.

FIELD OF THE INVENTION

The present invention relates to a technique of implementing a test mode in a variety of devices, including integrated circuits.

BACKGROUND OF THE RELATED ART

The use of test techniques to test electrical circuitry allows various diagnostic procedures to be performed on integrated circuit devices. Testing performed on integrated circuit devices validate and/or debug various component parts as part of a validation procedure when the devices are manufactured. For example, when an integrated circuit device is manufactured, validation tests are performed on the product to ensure that the manufactured component operates properly. Debugging features of a test procedure also allows various states to be monitored while the component is subjected to operating conditions. For example, as part of a debugging procedure, output lines from an integrated circuit may be monitored to determine the nature of the error and/or to localize the error to a particular circuitry or operation.

Generally, integrated circuit chips enter a test mode simply by having signals present on some combination of input pins to the integrated circuit. In this instance, the signals indicate the particular test to be performed, and the integrated circuit is activated into a particular test based on the signals at the selected combination of input pins. The signals initiate a selected test, and subsequent output is then generated in response to the performed test. With these types of testing procedures, the integrated circuit enters the particular test state with the test signal. The various state signals generated, including output states, are in response to the sequence of operations performed as part of the particular test procedure.

Although these procedures allow testing to be performed on a device, these procedures do not allow for the integrated circuit to toggle between a given test procedure and a normal operative state of the integrated circuit. Although continuous test procedures are applicable for verification and debugging of integrated circuits, a need exists to have a scheme, which allows a particular test procedure to be interrupted and toggled between the test mode and the normal operative mode.

SUMMARY

A test mode control unit of an integrated circuit has a sample and hold circuit to receive a test mode signal upon occurrence of a reset condition to perform a selected test of the integrated circuit in response to the test mode signal. A decoder decodes the test mode signal and generates a decoded control signal to control test circuitry of the integrated circuit to perform the selected test. A logical circuit receives the decoded control signal and a test signal. The logical circuit initiates the selected test if the test signal indicates a test state but maintains the integrated circuit in its normal non-test state if the test signal does not indicate the test state. The test signal allows toggling between test and non-test modes of operation for the integrated circuit.

BRIEF DESCRIPTION OF THE DRAWINGS

Embodiments of the present invention are illustrated by way of example and are not for the purpose of limitation. In the figures of the accompanying drawings, similar references are utilized to indicate similar elements.

DETAILED DESCRIPTION OF THE INVENTION

Figure 1:
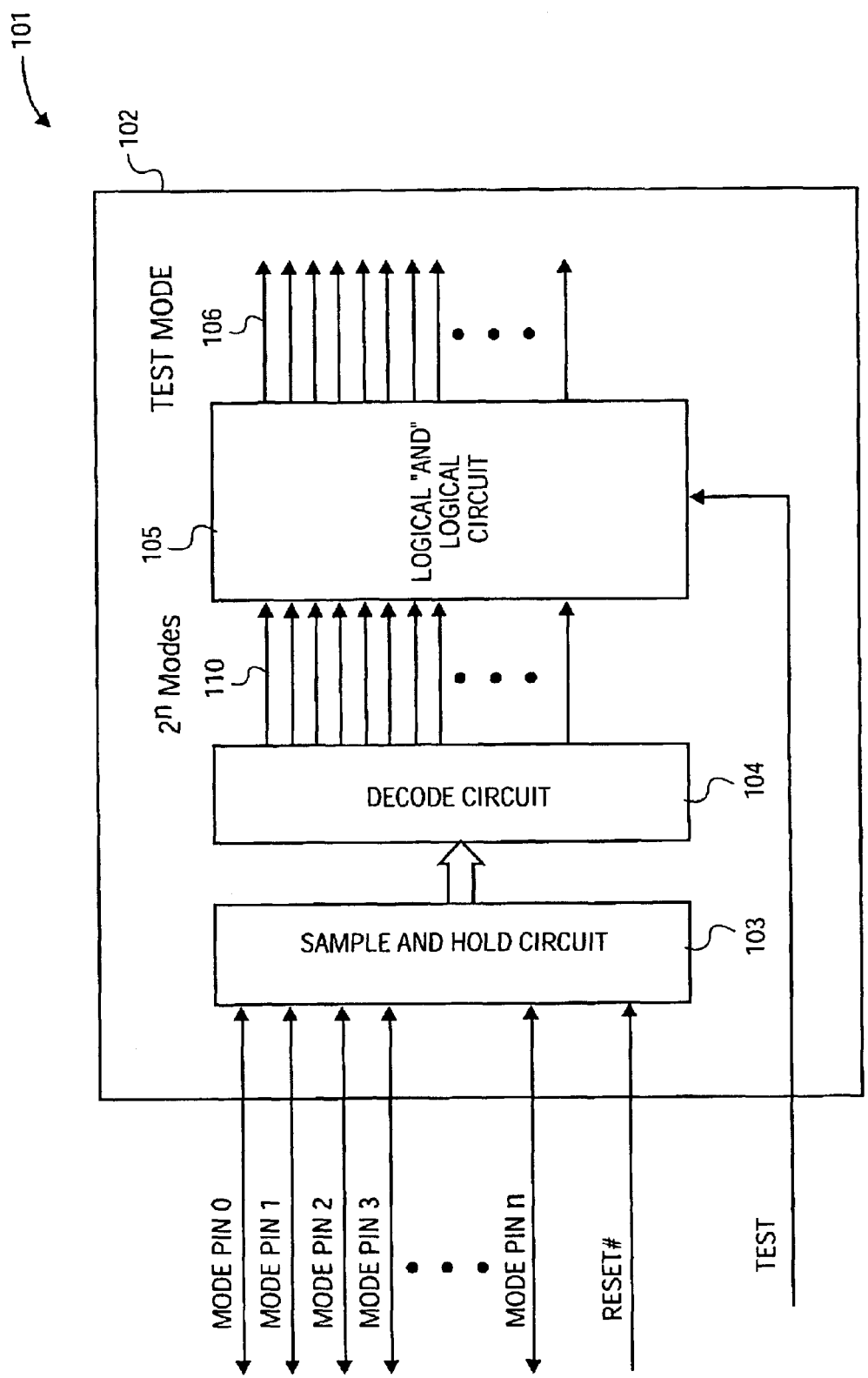
FIG. 1 shows a block schematic diagram of an exemplary embodiment of a test mode control circuit.

FIG. 1 illustrates a test mode control unit 101, which typically is part of an integrated circuit device (or chip). Generally, test mode control unit 101 places the integrated circuit (IC) into a specialized mode of operation, commonly referred to as a test mode. Test mode control unit 101 shown in FIG. 1 is just one example of an embodiment for implementing the invention. Test mode control unit 101 is designed to be implemented within an integrated circuit 102, which is exemplified by the solid line surrounding test mode control unit 101. Integrated circuit 102 includes a variety of circuitry to perform the various intended operations of the integrated circuit. The normal operative circuitries for integrated circuit 102 are not shown in FIG. 1. Furthermore, various test circuitry which may perform the tests are also not shown in FIG. 1. Only that portion of the circuitry associated with placing the integrated circuit 102 into and out of the selected test mode is shown in FIG. 1.

In the particular embodiment of the invention shown in FIG. 1, test mode control unit 101 includes a sample and hold circuit 103, a decode circuit 104, and a logical circuit 105. Logical circuit 105, in this instance, is shown as a logical "AND" circuit. In test mode control unit 101, various inputs to sample and hold circuit 103 are shown as test mode inputs through test mode pins 0 to n. The inputs for test mode pins 0 to n are external inputs to integrated circuit 102. The actual number of mode pin inputs depend on the implementation of the particular integrated circuit as well as the number of test modes desired.

A reset signal RESET# (which activates with a low value) is also coupled as an input to sample and hold circuit 103. Sample and hold circuit 103 receives the test mode input signals on the various mode pins and latches in the sampled mode signals when RESET# signal resets sample and hold circuit 103. The output of sample and hold circuit 103 is coupled to decode circuit 104, such that when the RESET# signal resets sample and hold circuit 103, the test mode signals on the mode pins are coupled as the output of the circuit 103. This signal is then decoded by decode circuit 104 to generate decoded control signals. In one embodiment, up to $2^n$ decoded control signals may be available from "n" mode pin inputs to sample and hold circuit 103.

The decoded control signal output of decode circuit 104 is coupled as an input into logical circuit 105. Logical circuit 105 also receives a TEST signal. In the embodiment shown in FIG. 1, the TEST signal is also received as an external signal of integrated circuit 102. However, some or all of these signals (mode signal, RESET#, and TEST) may be generated internally within the integrated circuit in other embodiments. The TEST signal initiates the test mode for test mode control unit 101. Although a variety of logical operations may be performed, the exemplary embodiment utilizes the "AND" logic so that the $2^n$ mode output from decode circuit 104 is coupled through as the output of logical circuit 105 when the TEST signal is active. In the particular exemplary embodiment, the TEST signal is active when the TEST signal is in a high state. Thus, the output of decode circuit 104 corresponds to the decoded test control signals, and these signals may then be coupled through logical circuit 105 when the TEST signal is high. If the TEST signal is low, then the test control signals from decode circuit 104 are not output from logical circuit 105. When the TEST signal is in the non-test state (low state in the example), the output from logical circuit 105 is logical zeros.

In operation, a given test signal associated with a corresponding test is coupled as an input to test mode control unit 101 on mode pins 0 to n. After the test mode signals are available at the input of sample and hold circuit 103, the RESET# signal goes active low to latch in the test mode signals. Sample and hold circuit 103 holds this signal state and couples the signal to decode circuit 104. Decode circuit 104 decodes the test mode signals to generate corresponding decoded test control output signals, which are then input to logical circuit 105. The output of decode circuit 104 corresponds to the various control signals that control the operation of the various test and/or debug circuitry present on integrated circuit 102.

The decoded control signals from decode circuit 104 are coupled to logical circuit 105 but are coupled through output lines 106 as an output from logical circuit 105 when the TEST signal activates the test mode. Otherwise, output lines 106 indicates a non-test mode condition so that integrated circuit 102 continues to operate in a normal mode of operation. Therefore, even though the test mode input signals are sampled and decoded, the actual control signals are not permitted to be distributed to the test circuitry of integrated circuit 102 until the TEST signal is active high. In this manner, test mode control unit 101 receives and generates the requisite control signals to perform the various test operations commanded by the test mode signal on mode pins 0-n but integrated circuit 102 does not actually enter the designated test mode until the TEST signal is active.

After test mode control unit 101 enters the test mode, integrated circuit 102 performs the designated test selected by the test mode signal. Integrated circuit 102 is then permitted to exit the test mode simply by changing the state of the TEST signal. For example, in the exemplary embodiment of FIG. 1, the integrated circuit exits the test mode when the TEST signal goes low. However, since control signals 110 from decode circuit 104 are still present, integrated circuit 102 is permitted to reenter the test mode simply by placing TEST to a high state again. Thus, by changing the state of the TEST signal, logical circuit 105 toggles between a test and non-test mode output on lines 106. When in the test mode, logical circuit 105 generates an output on lines 106 corresponding to the control signals for performing the test and/or debugging procedures. However, when the TEST signal is low, then logical circuit 105 no longer generates the test control signal output on lines 106 so that integrated circuit 102 is not placed in the test mode allowing integrated circuit 102 to perform normal operation. Therefore, by simply toggling the TEST signal, the test mode control unit 101 is permitted to toggle between test and non-test modes.

Subsequently when another test mode is to be entered, new signals are placed on mode pins 0 to n and sampled by sample and hold circuit 103 with initiation of the RESET# signal. The test mode input signal is coupled to decode circuit 104 whenever the RESET# signal initiates the reset condition. The new control signals from decode circuit 104 is permitted to toggle by the operation of logical circuit 105 under control of the TEST signal so that integrated circuit 102 toggles in and out of the new test mode.

Figure 2:
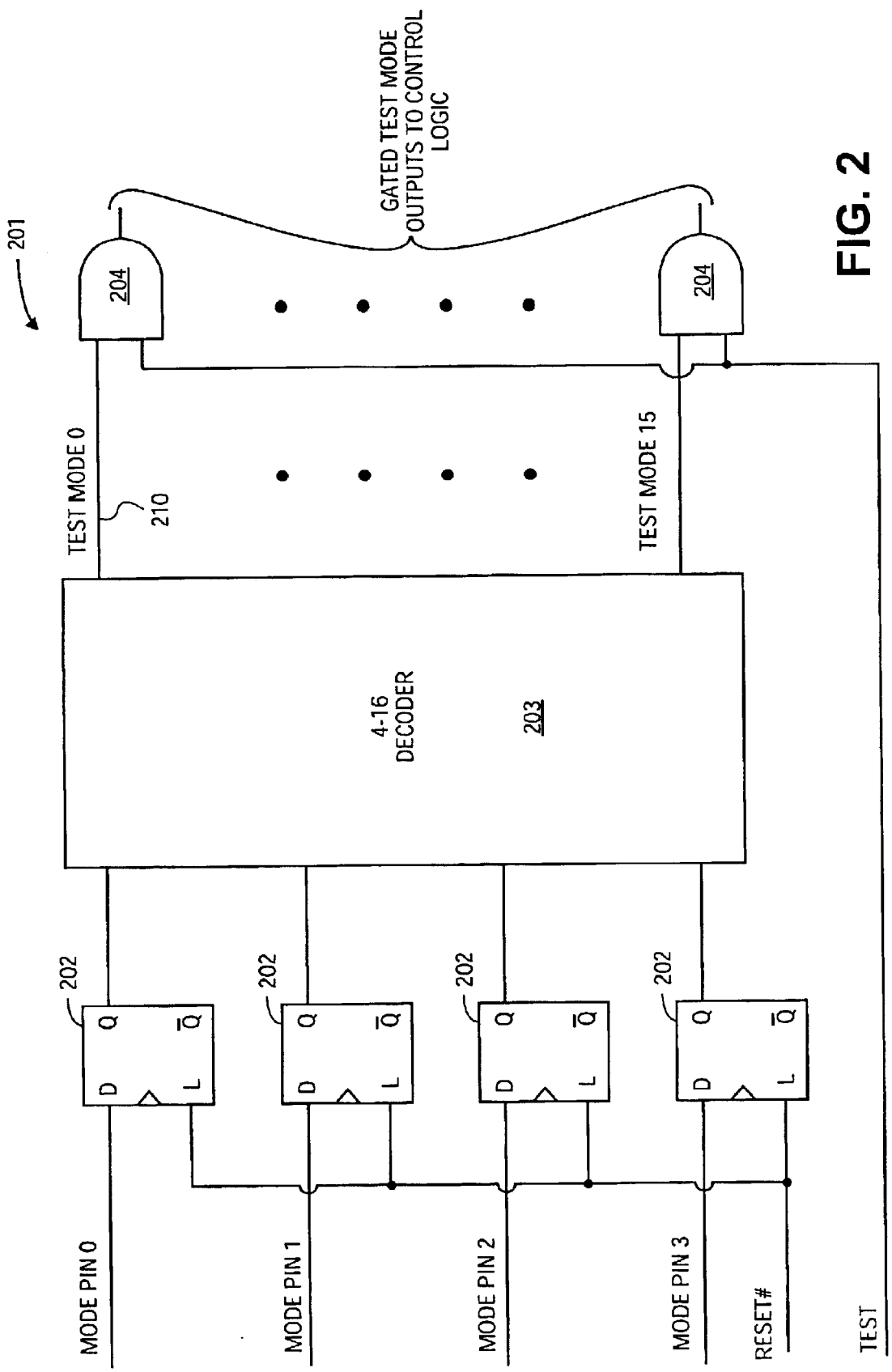
FIG. 2 shows an exemplary schematic circuit diagram that is employed for the test mode control circuit of FIG. 1.

FIG. 2 shows one exemplary embodiment of test mode control unit 101 of FIG. 1. Test mode control circuit 201 also includes equivalent circuitry to perform the sample, hold, and decode operation as well as the logical operation to toggle in and out of the test mode. Test mode control circuit 201 includes a set of latches 202 arranged in parallel to latch in the sampled test mode signal inputs from the test mode pins of the integrated circuit. In the particular embodiment shown, latches 202 include D-type flip/flops, which sample and latch in the test mode signals when RESET# signal is received on the reset line. In the particular example, only four latches 202 are shown to couple in four test mode signal inputs through mode pins 0 3. Accordingly, latches 202 correspond to the sample and hold circuit 103 of FIG. 1.

Latches 202 hold the latched values and couple the test mode signal to decoder 203. Decoder 203 is a 4-to-16 decoder, which receives the four test mode input signals and generates $2^n$ test mode control signals 210 to respective AND gates 204. The TEST signal is coupled as the second input to AND gates 204 so that when the TEST signal is high, the decoded control signals 210 are present at the outputs of AND gates 204. If the TEST signal is low, then the output of the AND gates are at the zero states (non-test mode state). Decoder 203 corresponds to decode circuit 104 of FIG. 1, and the AND gates 204 correspond to the AND logical circuit 105 of FIG. 1. The AND operation is a logical operator, and other equivalent logic may be readily substituted for logical circuit 105.

Figure 3:
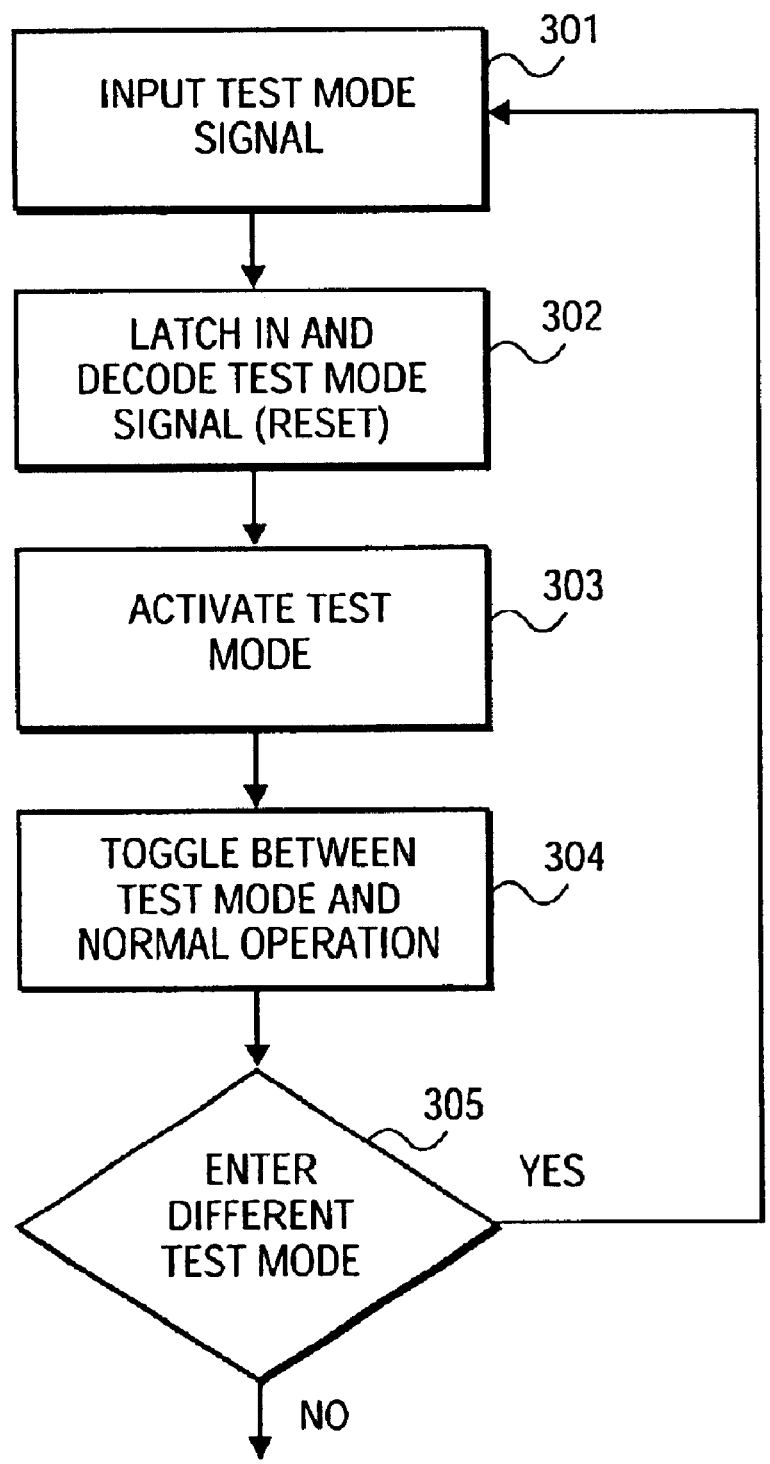
FIG. 3 shows an exemplary embodiment of a flow diagram to initiate the test mode using the test mode control circuit of FIG. 1 or 2.

FIG. 3 shows a flow diagram on how the test mode is performed. As noted previously, the input test mode signal is coupled to the input of the mode pins of the integrated circuit under test (block 301). Sample and hold circuit 103 latches in the signal when the reset signal is activated. The latched in signal is then coupled to decoder 203 to decode the test mode signal (block 302). Although the decoder outputs the control signals for performing the actual test procedure, the test mode control unit is not placed into the test mode until it is activated by the TEST signal (block 303 By changing the state of the TEST signal, the test mode is toggled between test mode and normal operation (block 304). When the particular test is completed, a different test mode is entered by placing a different test mode signal at the input of the mode pins (block 305), and the sequence repeated with the new test procedure. The method described above is performed with the described circuitry of FIGS. 1 and/or 2, or other equivalent circuitry.

Figure 4:
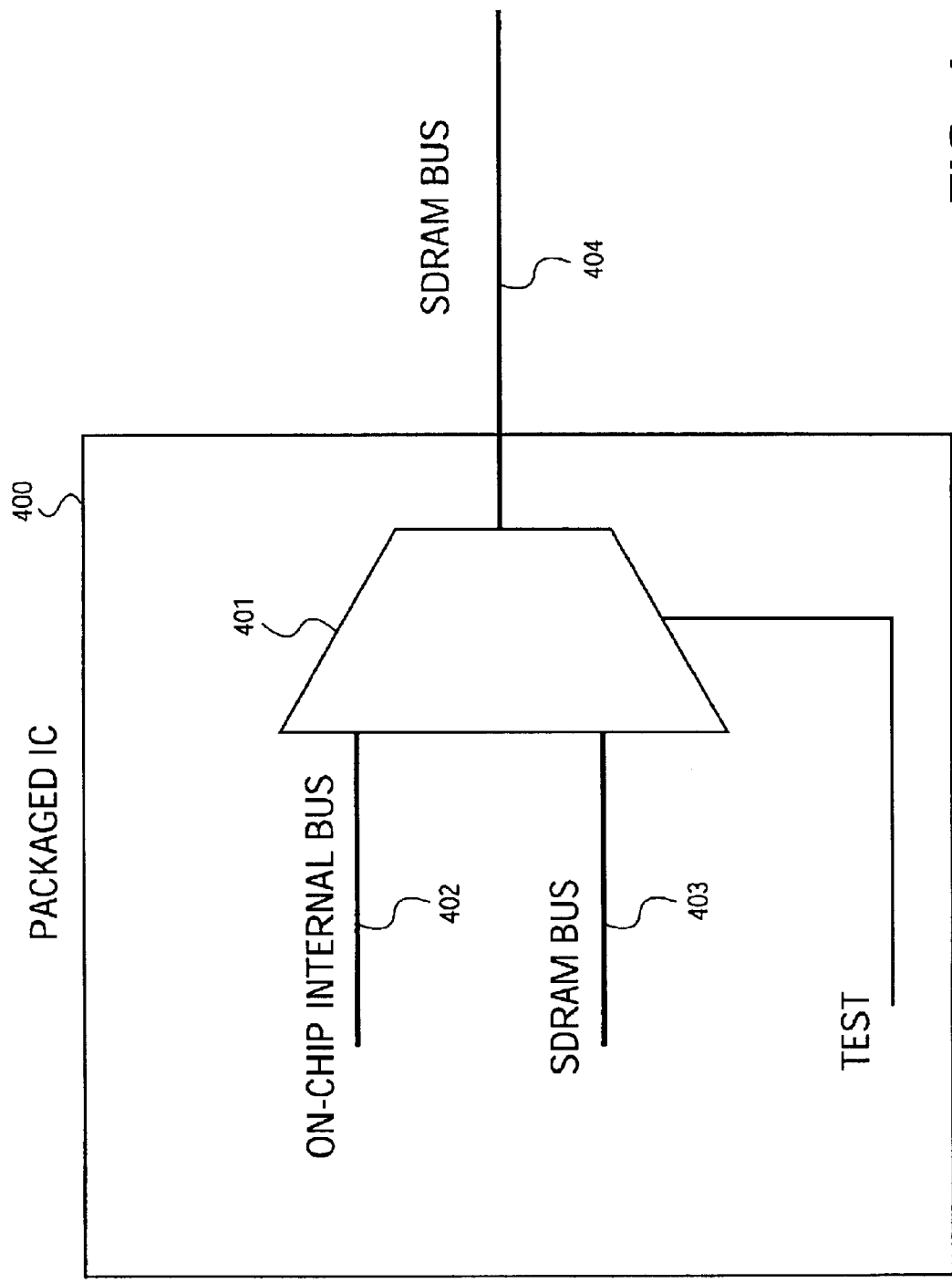
FIG. 4 shows an exemplary schematic circuit diagram for selecting between normal operative data and test data when the test mode is toggled.

FIG. 4 shows one application of the toggling technique of the test mode to selectively choose between two outputs on the integrated circuit. In an example packaged integrated circuit 400, a multiplexer (MUX) 401 is utilized to select between an on-chip internal bus 402 and the on-chip data bus, which in the exemplary embodiment is an Synchronous Dynamic Random Access Memory (SDRAM) bus 403. The output of MUX 401 is an SDRAM bus 404, which is coupled externally to integrated circuit 400. Generally, the SDRAM bus 403 that is internal to integrated circuit 400 and SDRAM bus 404 that is external to integrated circuit 400 are the same bus. However, since the test mode is toggled utilizing the circuitry of FIG. 1 and/or 2, MUX 401 is utilized to select between buses 402 and 403 for output onto bus 404. Thus, in normal operations, data is transferred onto SDRAM buses 403 and 404. In one embodiment, external bus 404 is coupled to a memory system for transfer of data between the memory system and integrated circuit 400. However, when integrated circuit 400 enters the test mode, on-chip internal bus 402 is coupled as an output onto bus 404. The TEST signal is utilized as the selection signal for MUX 401. If the on-chip internal bus 402 is configured to generate various test/debug signals when in the test mode, then the operation of MUX 401 allows debugging signals to be output onto SDRAM bus 404. Other switching components are utilized in place of MUX 401 to perform the switching between two buses.

Accordingly, under the test mode condition, internal test signals are output from integrated circuit 400 onto bus 404 and monitored for test/debug operations. The toggling capability allows integrated circuit 400 to operate normally or operate in the test mode. The toggling capability allows testing/debugging to be performed under real time conditions. As the integrated circuit operates normally in real time, toggling the test mode allows tests to be performed and results/states output from internal sources for real time analysis. Therefore, real time debugging are performed simply by operating the chip at its normal operation and toggling in and out of the test mode. In one embodiment, data transfer is achieved on data bus 404, but when no data are present on the data bus 404, the TEST signal toggles integrated circuit 400 into the test mode so that test signals are output from integrated circuit 400 onto the data bus.

Figure 5:
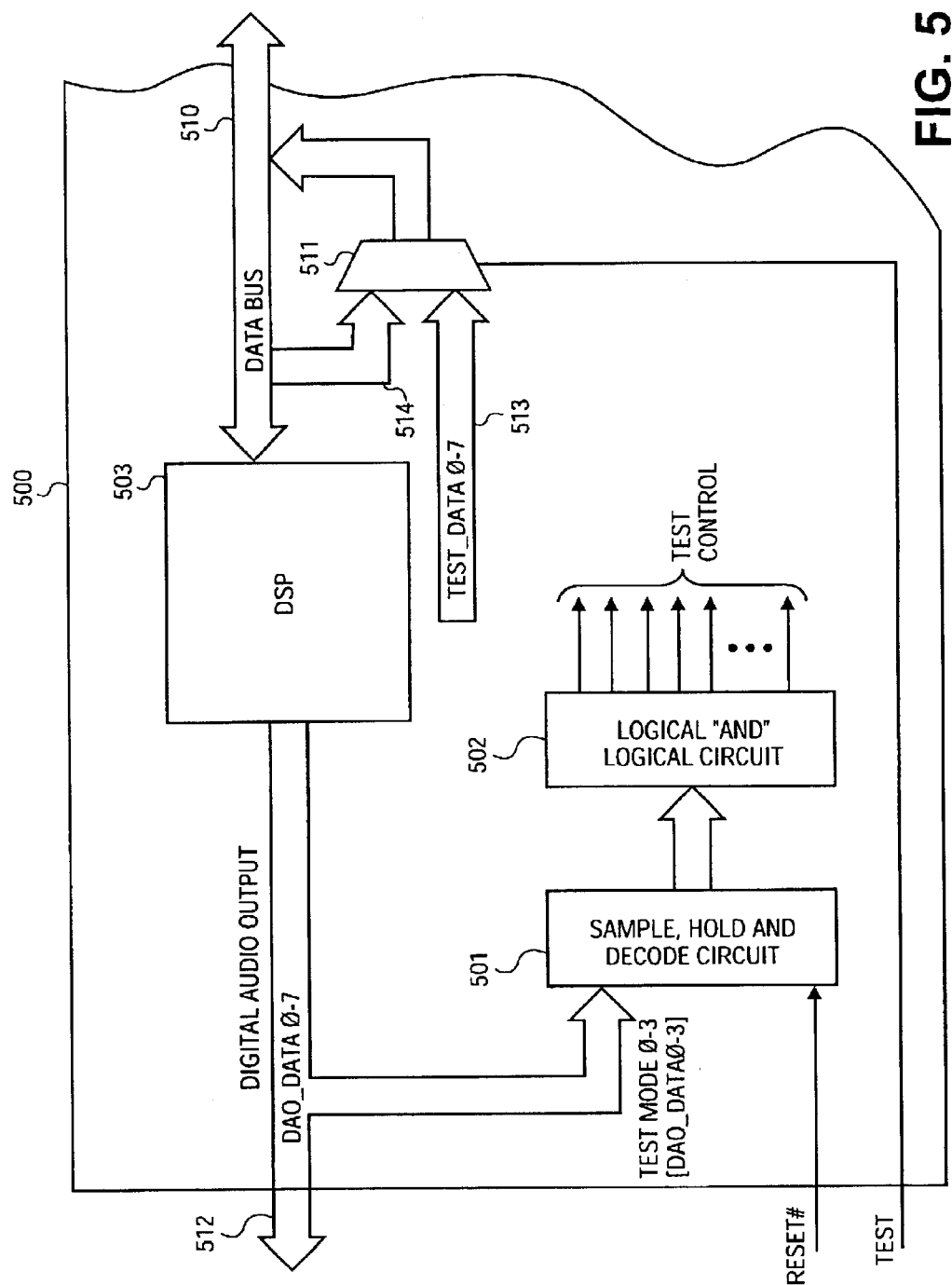
FIG. 5 shows an exemplary block schematic diagram of an integrated circuit having a DSP for audio application and utilizing an embodiment of a test mode control scheme.

FIG. 5 illustrates one embodiment of the invention implemented in an audio integrated circuit chip 500 ("integrated circuit 500"). In the exemplary circuit of FIG. 5, a sample, hold, and decode circuit 501, that corresponds to the sample and hold circuit 103 and the decode circuit 104 of FIG. 1, receives test mode input signals as its inputs. The reset signal is also received and shown as RESET# along with the test signal TEST. In this particular exemplary embodiment, circuit 501 combines the sample and hold circuit and the decode circuit as a single unit. However, the circuitry is separated into more than one stage as was shown in FIGS. 1 and 2. The output of the sample, hold, and decode circuit 501 is coupled to "AND" logical circuit 502.

As noted with FIGS. 1 and 2, the TEST signal is coupled as an input to "AND" logical circuit 502. Integrated circuit 500 is an audio chip and performs various conversion and/or processing to produce an audio data output. A digital signal processor (DSP) 503 transfers digital data with an external device (such as a memory system) on bus 510. Integrated circuit 500 has a DSP 503. However, the present invention is not in any way limited to just being utilized with a DSP, and the present invention may be utilized in conjunction with any analog or digital processor/processing chip. The processed data from DSP 503 is digital audio data, which is shown as digital audio data output DAO_DATA 0-7. This audio data output corresponds to an 8-bit audio data from DSP 503. In normal operation, the DSP 503 processes data received on bus 510 and generates the audio output on bus 512.

The RESET# and the TEST signals are coupled through dedicated pins on integrated circuit 500. The input test mode signals to circuit 501 is input through dedicated pins, but, in the particular example shown, the DAO_DATA lines are utilized as for coupling the test mode signals. In the example of FIG. 5, DAO_DATA 0-3 are utilized to couple the test mode input signals. In this manner, additional pins are not needed for the input of the test mode signals to circuit 501 to select the desired test mode. By multiplexing the audio output line to accept the test mode input signal at reset, dedicated test mode signal pins are not needed. In the example, this selection is achieved at the initiation of a reset condition. Once the reset signal latches the test mode signals through the circuit 501, the test signal for selecting the particular test is latched in so that bus 512 is utilized to output audio. Generally, input/output (I/O) signal lines are multiplexed to input the test mode signal with the reset signal. However, other signal or control lines are used as well.

The decoded test signal from sample, hold, and decode circuit 501 provides various control signals, which are only passed to the test circuits of integrated circuit 500 when the TEST signal goes high, permitting the control signals to be coupled as output from "AND" logical circuit 502. The TEST signal is also coupled to MUX 511 to select between an internal test data bus 513 and internal portion 514 of data bus 510. MUX 511 selects between normal data and test data to be coupled onto bus 510. This operation is equivalent to MUX 401 selecting between SDRAM bus 403 and on-chip internal bus 402 in FIG. 4.

When integrated chip 500 enters the test mode by the activation of the TEST signal, MUX 511 selects test data bus 513 to be output onto bus 510 so that test/debug information is made available external to integrated circuit 500. By toggling the TEST signal, integrated circuit 500 enters and exits a particular selected test mode and test/debug information evaluated. The selection is achieved at real time, if desired. When another test mode is to be initiated, the new test mode input signal is input and the sequence repeated with the new test mode. Again, other switching components are utilized, if multiplexing is desired to place test data and/or state variable states onto the I/O lines (or bus) for test and/or debug operations.

The test control signals generated perform a variety of tests on the integrated circuit. Exemplary tests include manufacturing type of tests, including clock output, voltage level, current level, signal output, impedance, logic level, scan, speed and/or performance tests. The tests may also take the form of operational tests, including internal bus visibility and state machine visibility tests. The tests, especially the operational tests, are performed by multiplexing internal signals/states onto an I/O bus. The tests are performed in real time by toggling between normal mode and test mode for an integrated circuit.

Thus, a scheme for test mode control is described. While the embodiments of the invention have been particularly shown and described, it will be understood by those skilled in the art that various changes in form and detail may be made therein without departing from the spirit and scope of the invention.

I claim:

1. An apparatus comprising:
   a first circuit to receive and decode a test mode signal to identify a test to be performed in an integrated circuit; and
   a second circuit to receive a decoded test mode signal from said first circuit and use the decoded test mode signal to perform a selected test and output result of the selected test when a test signal is in a first state, but to maintain a normal operation of the integrated circuit to generate a normal operational output if the test signal is in a second state, wherein, while the integrated circuit operates in the normal operation, a real time testing action is performed by said second circuit toggling between test and normal operational modes of the integrated circuit in response to states of the test signal.

2. The apparatus of claim 1 wherein said first circuit further includes a sample and hold circuit to sample and hold the received test mode signal to be decoded.

3. The apparatus of claim 2 wherein the sample and hold circuit comprises a latch.

4. The apparatus of claim 1 wherein said first circuit receives the test mode signal on data lines utilized for input/output at initiation of a reset condition and decodes the test mode signal in response to the reset condition.

5. The apparatus of claim 1 wherein said second circuit includes logic gates to logically AND the decoded control signal and the test signal to toggle between test and normal operational modes of operation.

6. The apparatus of claim 1 further comprising a switching component to switch internal test data onto an external bus to output test data external to the integrated circuit.

7. The apparatus of claim 6 wherein said switching component is a multiplexer and output switching is to be controlled by the test signal.

8. The apparatus of claim 6 wherein the switching component switches outputs between internal test data and normal operational data to perform debug of the integrated circuit during a real time operation of the integrated circuit.

9. An integrated circuit comprising:
  a sample and hold circuit to receive a test mode signal and to hold the received test mode signal;
  a decode circuit to receive the test mode signal from said sample and hold circuit, to decode the test mode signal to identify a real time testing action to be performed in an integrated circuit;
  a logic circuit to receive a decoded test mode signal and a test signal, said logic circuit to initiate a selected test identified by the decoded test mode signal if the test signal is in a first state, but to maintain a normal operation of the integrated circuit if the test signal is in a second state, said logic circuit multiplexed to toggle between providing output results of the selected test and the normal operation of the integrated circuit in response to the state of the test signal wherein the real time testing action is performed by toggling between the output results.

10. The integrated circuit of claim 9 wherein said sample and hold circuit comprises a plurality of latches that are activated to latch in the test mode signal at initiation of a reset condition.

11. The integrated circuit of claim 9 wherein said sample and hold circuit receives the test mode signal on data lines utilized for input/output at initiation of a reset condition and the decode circuit decodes the test mode signal in response to the reset condition.

12. The integrated circuit of claim 11 wherein said decode circuit comprises a decoder to generate up to $2^n$ test selections for n inputs of the test mode signal.

13. The integrated circuit of claim 11 wherein said logic circuit includes logic gates to logically AND the decoded test mode signal and the test signal to toggle between test and normal modes of operation.

14. The integrated circuit of claim 13 further comprising a switching component to multiplex test data and normal operational data onto an external bus to output test results or normal operational data external to the integrated circuit.

15. The integrated circuit of claim 14 wherein said switching component is a multiplexer.

16. The integrated circuit of claim 14 wherein the switching component switches between internal test data and normal operational data to perform debug of the integrated circuit during a real time operation of the integrated circuit.

17. The integrated circuit of claim 9 wherein said sample and hold circuit receives the test mode signal on data lines utilized for output of audio data at initiation of a reset condition and the decode circuit decodes the test mode signal in response to the reset condition.

18. A method comprising:
  receiving a test mode signal;
  latching the received test mode signal upon occurrence of a reset condition;
  decoding the latched test mode signal to generate a decoded test mode signal used to identify a selected test to be performed;
  utilizing the decoded test mode signal to perform a test and output results of the test if a test signal is in a first state, but to maintain a normal operation and output normal operational data, if the test signal is in a second state; and
  performing a real time testing action while an integrated circuit operates in a normal operational mode by toggling between a test mode and the normal operational modes of operation in response to states of the test signal to output test and normal operational data.

19. The method of claim 18 further comprising performing debug operation in real time by multiplexing test and normal operational data onto an output bus.

20. The method of claim 18 wherein the receiving of the test mode signal comprises receiving the test mode signal on an input/output data bus.

* * * * *